United States Patent
Chen et al.

(10) Patent No.: US 11,778,739 B2
(45) Date of Patent: Oct. 3, 2023

(54) THERMALLY CONDUCTIVE BOARD

(71) Applicant: Polytronics Technology Corp., Hsinchu (TW)

(72) Inventors: Kuo Hsun Chen, Toufen (TW); Cheng Tsung Yang, Taoyuan (TW); Feng-Chun Yu, Yuanshan Township (TW); Kai-Wei Lo, Zhubei (TW)

(73) Assignee: POLYTRONICS TECHNOLOGY CORP., Hsinchu (TW)

( * ) Notice: Subject to any disclaimer, the term of this patent is extended or adjusted under 35 U.S.C. 154(b) by 284 days.

(21) Appl. No.: 17/188,528

(22) Filed: Mar. 1, 2021

(65) Prior Publication Data

US 2022/0201856 A1    Jun. 23, 2022

(30) Foreign Application Priority Data

Dec. 22, 2020   (TW) .................................. 109145468

(51) Int. Cl.
*H05K 1/05* (2006.01)
*H01L 23/373* (2006.01)

(52) U.S. Cl.
CPC ......... *H05K 1/053* (2013.01); *H01L 23/3735* (2013.01); *H05K 1/056* (2013.01); *H05K 2201/0129* (2013.01); *H05K 2201/0175* (2013.01); *H05K 2201/0191* (2013.01); *H05K 2201/0209* (2013.01); *Y10T 428/12569* (2015.01)

(58) Field of Classification Search
None
See application file for complete search history.

(56) References Cited

U.S. PATENT DOCUMENTS

| | | | | |
|---|---|---|---|---|
| 4,713,284 | A * | 12/1987 | Hasegawa | B32B 15/20 156/247 |
| 6,548,152 | B2 * | 4/2003 | Nakatani | H01L 23/49833 428/209 |
| 2009/0214531 | A1 * | 8/2009 | Mekalanos | C07K 16/1203 424/257.1 |
| 2020/0031723 | A1 * | 1/2020 | Inoue | C04B 41/83 |
| 2020/0185303 | A1 * | 6/2020 | Yeh | H01L 23/367 |

FOREIGN PATENT DOCUMENTS

| | | |
|---|---|---|
| TW | 200942114 A | 10/2009 |
| TW | 201007901 A | 2/2010 |
| TW | 201108904 A1 | 3/2011 |

* cited by examiner

*Primary Examiner* — Seth Dumbris
(74) *Attorney, Agent, or Firm* — MUNCY, GEISSLER, OLDS & LOWE, P.C.

(57) ABSTRACT

A thermally conductive board includes a metal substrate, a metal layer, a thermal conductive insulating polymer layer, and a ceramic material layer. The thermal conductive insulating polymer layer is located between the metal layer and the metal substrate. The ceramic material layer includes an upper ceramic layer or a lower ceramic layer, or includes both the upper ceramic layer and the lower ceramic layer. The upper ceramic layer is disposed between the metal layer and the thermal conductive insulating polymer layer, and the lower ceramic layer is disposed between the thermal conductive insulating polymer layer and the metal substrate.

8 Claims, 2 Drawing Sheets

THERMALLY CONDUCTIVE BOARD

BACKGROUND OF THE INVENTION

(1) Field of the Invention

The present application relates to a thermally conductive board, and more specifically, to a thermally conductive board capable of preventing significant drop of volume resistivity at high temperature and suitable for thick copper applications.

(2) Description of the Related Art

Generally, a circuit board is manufactured by disposing an electronic device, such as an integrated circuit (IC) chip, on a thermally conductive board and establishing electrical connection therebetween. It is known that, during operation, electronic device generates heat and heat gradually accumulates on the device, and heat is dissipated from bottom surface of the device via the thermally conductive board by thermal conduction. Serving as a heat transfer media, the thermally conductive board could be a metal core printed circuit board (MCPCB) or a directed bonded copper (DBC) ceramic substrate.

Although DBC ceramic substrate can endure temperature as high as over 1000° C., ceramic is expensive. In addition, because ceramic is brittle and fragile, it is difficult for DBC ceramic substrate to undergo mechanical processing treatment such as drilling and cutting process during manufacturing process thereof. Further, since a copper foil and a ceramic layer differs significantly in coefficient of thermal expansion (CTE), for thick copper applications (e.g., copper foil having a thickness of 0.3-10 mm), it is very likely that, at high temperature, delamination between the copper foil and the ceramic layer occurs.

MCPCB uses polymer as a matrix material in a thermally conductive and electrically insulating layer of MCPCB in which a large amount of thermal conductive fillers are uniformly dispersed. Two metal foils are coupled to upper and lower surfaces of the thermally conductive and electrically insulating layer, respectively, to form a thermally conductive board of a laminated structure. In compassion with ceramic, polymer is much less expensive, and it is much easier for polymer to be subject to mechanical processing treatment. Also, the thermally conductive and electrically insulating layer is tightly bonded with the metal foil. Therefore, MCPCBs replace DBC ceramic substrate in many applications used for heat dissipation.

However, after MCPCB is provided with power, electronic devices arranged on MCPCB generate heat, resulting in that MCPCB is heated to a temperature up to 100-250° C. Also, an electrical field is formed between the two metal foils respectively attached to upper and lower surfaces of the thermally conductive and electrically insulating layer. At normal condition, polymer is a material that is electrically insulating. However, once the board is affected by external electrical field, electric dipoles are formed on polymer chains due to polarization effect caused by electrical field, i.e. electric polarization phenomenon. Therefore, the electric dipoles formed on the polymers, particularly the polymer chains, begin to arrange along a certain direction. Orientation and arrangement make the polymer finally become somewhat electrically conductive. At low temperature, orientation and arrangement of polymer chains cannot catch up with variation of electrical field, and thus the polymer is not so conductive. However, as temperature gradually rises after MCPCB is provided with power, movement of polymer becomes more easily, and orientation and arrangement of polymer chains can catch up with variation of electrical field, resulting in that electrical conductivity of polymer increases or electrical insulation of polymer decreases. As a consequence, the thermally conductive and electrically insulating layer has a very lower volume resistivity at high temperature as opposed to low temperature. As an example, a ratio of volume resistivity at 175° C. to volume resistivity at 25° C. for the thermally conductive and electrically insulating layer is at least less than $10^{-6}$.

In addition to the forgoing, MCPCB has the problem of ionic migration, e.g. migration of copper ions. The so-called ionic migration is that metals such as copper or silver on a circuit board may be ionized in high-temperature and high-humidity environment and the ions go to another electrode through an insulating layer (i.e., the thermally conductive and electrically insulating layer in MCPCB) to degrade insulation. Ionic migration occurs because, after the thermally conductive board is provided with power, an electric field forms between the two metal foils respectively attached to upper and lower surfaces of the thermally conductive and electrically insulating layer (or between two adjacent conductive lines). The metal foils at two sides of MCPCB become two electrodes, in which one electrode serving as anode is ionized, and ions are affected by the electric field to migrate to another electrode serving as cathode through the insulator. As a result, the thermally conductive and electrically insulating layer loses insulation characteristic and becomes ionic conductive, causing short-circuit. If MCPCB is subject to high temperature and high humidity biased test (HHBT), it is expected that migration of copper ions occurs, insulation is degraded, and voltage endurance is lowered.

Accordingly, there is a need to provide a MCPCB without the above-said issues.

SUMMARY OF THE INVENTION

The present application provides a thermally conductive board in which a ceramic material layer is included to increase voltage endurance. Moreover, an appropriate ratio of a roughness of a metal layer and a metal substrate to a thickness of the ceramic material layer increases bonding strength between layers, therefore the present application is particularly suitable for thick copper applications. Further, the thermally conductive board of the present application exhibits superior heat dissipation characteristics.

In accordance with an embodiment of the present application, the present application provides a thermally conductive board. The thermally conductive board includes a metal substrate, a metal layer, a thermal conductive insulating polymer layer, and a ceramic material layer. The thermal conductive insulating polymer layer is located between the metal layer and the metal substrate. The ceramic material layer includes an upper ceramic layer or a lower ceramic layer, or includes both the upper ceramic layer and the lower ceramic layer. The upper ceramic layer is disposed between the metal layer and the thermal conductive insulating polymer layer, and the lower ceramic layer is disposed between the thermal conductive insulating polymer layer and the metal substrate.

In an embodiment, a volume resistivity of the thermally conductive board at 175° C. is at least $10^9$ Ω·cm.

In an embodiment, a ratio of a volume resistivity at 175° C. to a volume resistivity at 25° C. for the thermally conductive board is defined as a retention value, and the retention value is at least $10^{-4}$.

In an embodiment, the upper ceramic layer forms a physical contact with the metal layer, and the lower ceramic layer forms a physical contact with the metal substrate.

In an embodiment, each of the upper ceramic layer and the lower ceramic layer have a thickness of 3-100 μm.

In an embodiment, a total thickness of the upper ceramic layer and the lower ceramic layer is 5-200 μm.

In an embodiment, each of the upper ceramic layer and the lower ceramic layer is a single material layer or a multi-layered composite material layer composed of a plurality of sublayers, and wherein each of the single material layer and the sublayers comprises aluminum oxide, zirconia, magnesium oxide, or titanium oxide.

In an embodiment, each of the metal layer and the metal substrate has a thickness of 0.3-10 mm.

In an embodiment, each of a lower surface of the metal layer and an upper surface of the metal substrate has a roughness Rz of 2-80 μm.

In an embodiment, a ratio of the roughness Rz to a thickness of the upper ceramic layer or the lower ceramic layer ranges from 0.2 to 0.8.

In an embodiment, voltage endurance of the thermally conductive board under HHBT at temperature of 85° C. and relative humidity of 85% for a duration of 1000 hours is at least DC1000V.

In an embodiment, a thermal resistance of the thermally conductive board is less than 0.16° C./W.

The thermally conductive board of the present application includes a ceramic material layer to prevent significant drop of volume resistivity at high temperature. Additionally, roughing a surface of a metal layer and/or a metal substrate increases bonding strength between layers. Therefore, the present application provides a solution to conventional DBC ceramic substrate which is not suitable for thick copper applications. Inclusion of a ceramic material layer also makes the thermally conductive board exhibit superior heat dissipation characteristics.

BRIEF DESCRIPTION OF THE DRAWINGS

The present application will be described according to the appended drawings in which.

DETAILED DESCRIPTION OF THE INVENTION

The making and using of the presently preferred illustrative embodiments are discussed in detail below. It should be appreciated, however, that the present application provides many applicable inventive concepts that can be embodied in a wide variety of specific contexts. The specific illustrative embodiments discussed are merely illustrative of specific ways to make and use the invention, and do not limit the scope of the invention.

Figure 1:
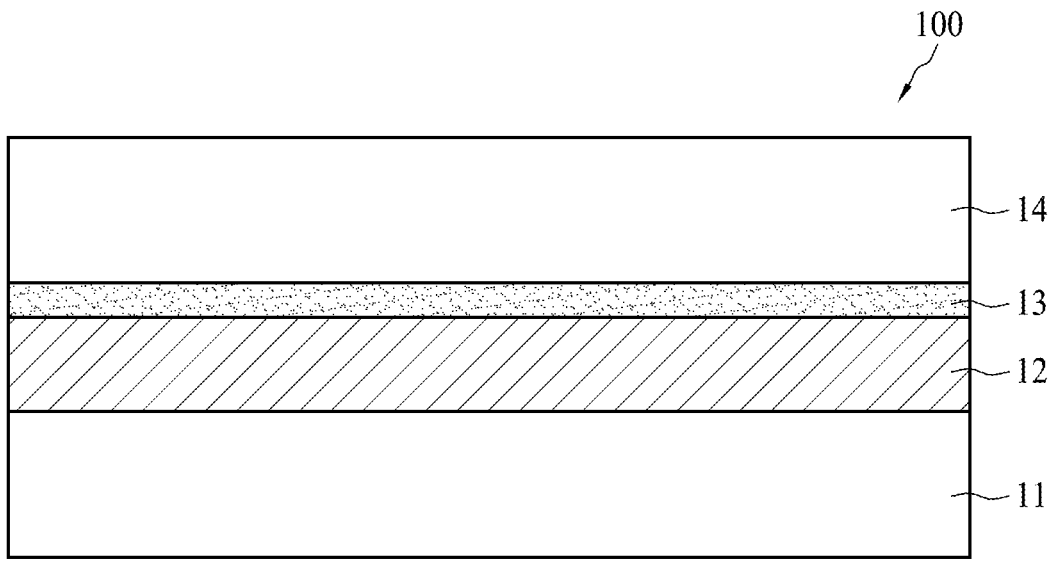
FIG. 1 shows a cross-sectional view of a thermally conductive board in accordance with a first embodiment of the present disclosure.
Figure 4:
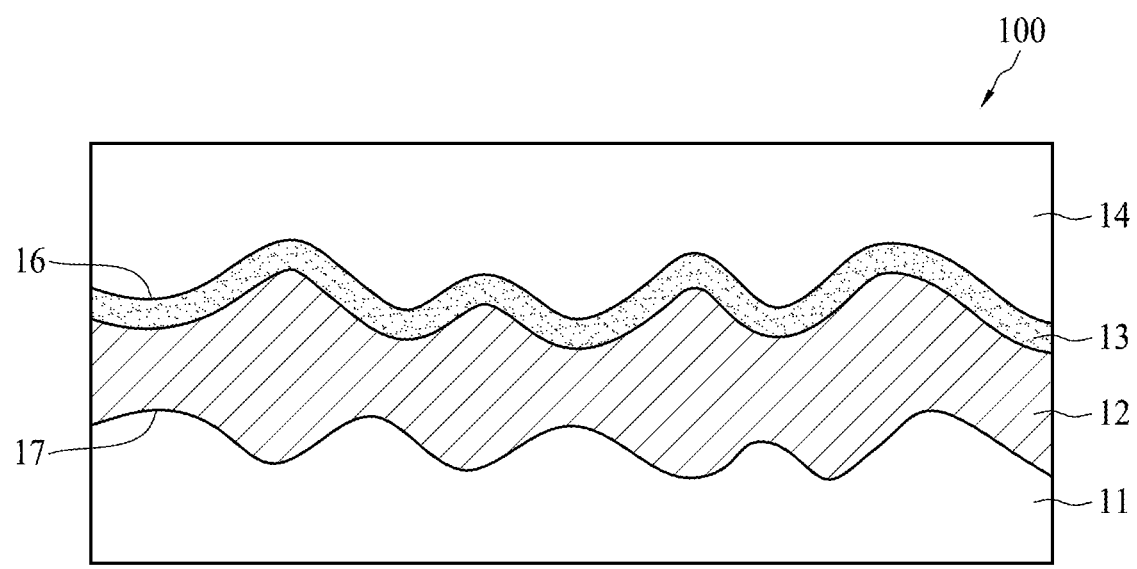
FIG. 4 shows a cross-sectional view of a thermally conductive board in accordance with a fourth embodiment of the present disclosure.

Referring FIG. 1, which shows a cross-sectional view of a thermally conductive board 100 in accordance with a first embodiment of the present disclosure. The thermally conductive board 100 comprises a metal substrate 11, a thermal conductive insulating polymer layer 12, a ceramic material layer 13, and a metal layer 14. The thermal conductive insulating polymer layer 12 is formed on the metal substrate 11, and is located between the metal layer 14 and the metal substrate 11. The thermal conductive insulating polymer layer 12 is a layer that is thermally conductive and electrically insulating. In the present embodiment, the ceramic material layer 13 serves as an upper ceramic layer of the thermally conductive board 100. The ceramic material layer (the upper ceramic layer) 13 is disposed between the metal layer 14 and the thermal conductive insulating polymer layer 12. In an embodiment, the metal layer 14 comprises copper, and the metal substrate 11 comprises copper, aluminum, or copper-aluminum alloy. The ceramic material layer (the upper ceramic layer) 13 forms a physical contact with the metal layer 14. Preferably, as shown in FIG. 4, an interface between the ceramic material layer (the upper ceramic layer) 13 and the metal layer 14 includes a microrough surface 16. Similarly, an interface between the metal substrate 11 and the thermal conductive insulating polymer layer 12 includes another microrough surface 17. Formation of the microrough surfaces 16 and 17 facilitates increase of bonding strength among the metal layer 14, the ceramic material layer (the upper ceramic layer) 13, the thermal conductive insulating polymer layer 12, and the metal substrate 11. In an embodiment, an etching process or a mechanical abrasion technique could be used to achieve surface roughness for the metal layer 14 and the metal substrate 11.

As described above, formation of surface roughness can facilitate increase of bonding strength between layers, therefore delamination problem due to significant difference in CTE between the metal layer and the ceramic material layer is prevented. Moreover, because of increase of bonding strength, gaps between layers are not easily produced, wherein gaps contribute to thermal resistance. Because the thermally conductive board can have a tighter and studier interior as well as better heat dissipation paths after formation of surface roughness, thermal resistance of the thermally conductive board is reduced. Additionally, owing to rough and/or undulating surface generated after formation of surface roughness, it is difficult for water to enter the thermally conductive board along interface between layers from side surface of board because a pathway along which water gets into the board is elongated. As a result, voltage endurance of the thermally conductive board in high-temperature and high-humidity environment is increased.

Roughness of lower surface of the metal layer and roughness of upper surface of the metal substrate should have a value falling within an appropriate numerical range, and should not be too high or too low. A too high roughness would result in problem of point discharge at tips of undulating surfaces of the metal layer and the metal substrate, leading to inferior voltage endurance. Also, it is difficult to carry out mechanical processing treatment. A too low roughness would not be possible for the thermally conductive board to have the above said functional advantages. In an embodiment, each of the lower surface of the metal layer and the upper surface of the metal substrate has a roughness Rz of 2-80 μm, such as 5 μm, 10 μm, 20 μm, 30 μm, 40 μm, 50 μm, 60 μm, or 70 μm. Preferably, a ratio of the roughness Rz to a thickness of the ceramic material layer (the upper ceramic layer) ranges from 0.2 to 0.8, such as 0.3, 0.4, 0.5, 0.6, or 0.7. Such a roughness makes the thermally conductive board have strong bonding strength between layers, excellent voltage endurance, and easiness in carrying out mechanical processing treatment for realizing roughness.

The thermal conductive insulating polymer layer 12 comprises polymer and thermal conductive fillers uniformly dispersed in the polymer. In an embodiment, the polymer could comprise thermoplastic resin, thermosetting resin, or a combination thereof. The thermal conductive fillers could comprise a material selected from an oxide or a nitride, wherein the oxide is aluminum oxide, magnesium oxide, zinc oxide, or titanium oxide, and the nitride is zirconium nitride, boron nitride, aluminum nitride, or silicon nitride.

The ceramic material layer (the upper ceramic layer) 13 could be a single material layer, which comprises aluminum oxide, zirconia, magnesium oxide, titanium oxide, or other ceramic material. Alternatively, the ceramic material layer (the upper ceramic layer) 13 could be a multi-layered composite material layer composed of a plurality of sublayers, and each of the sublayers comprises aluminum oxide, zirconia, magnesium oxide, titanium oxide, or other ceramic material as well. Different ceramic materials exhibit different properties. Therefore, depending on different products, the ceramic material layer (the upper ceramic layer) 13 can be formed as a single material layer or a multi-layered composite material layer composed of a plurality of sublayers, so as to meet characteristic requirements of products.

Except for the metal layer 14 and the metal substrate 11, only the thermal conductive insulating polymer layer 12 and the ceramic material layer (the upper ceramic layer) 13 in the thermally conductive board are electrically insulating. Therefore, an entirety of the thermal conductive insulating polymer layer 12 and the ceramic material layer (the upper ceramic layer) 13 constitutes a thermally conductive and electrically insulating layer of the board, or an entirety of the thermal conductive insulating polymer layer 12 and the ceramic material layer (the upper ceramic layer) 13 serves as a thermally conductive and electrically insulating layer of the board. The inventors of the present invention find that thermal resistance of polymer at high temperature of 100-250° C. is much lower than that at room temperature of 25° C. That is, thermal resistance of polymer decreases drastically as temperature rises. Nevertheless, ceramic endures high temperature, and thermal resistance thereof does not drop significantly at high temperature as opposed to room temperature. Therefore, with such structural design introducing both the thermal conductive insulating polymer layer 12 and the ceramic material layer 13, a volume resistivity of the thermally conductive and electrically insulating layer (including the thermal conductive insulating polymer layer 12 and the ceramic material layer 13) of the thermally conductive board 100 is prevented from dropping significantly at high temperature even if the thermal conductive insulating polymer layer 12 has a relatively low thermal resistance at high temperature of 100-250° C. when compared to that at 25° C. Thereby, the problem that volume resistivity of the thermally conductive board drops significantly at high temperature by solely using the thermal conductive insulating polymer layer as the insulating layer in conventional structure is solved. In addition, because the ceramic material layer (the upper ceramic layer) 13 is sandwiched between the metal layer 14 and the thermal conductive insulating polymer layer 12, the ceramic material layer (the upper ceramic layer) 13 blocks metal ions at lower surface of the metal layer 14 from migrating downwards, solving ionic migration problem. Moreover, it is because thermal conductivity of ceramic material is quite high that the ceramic material layer (the upper ceramic layer) 13 further lowers thermal resistance of the thermally conductive and electrically insulating layer. For example, thermal conductivities of aluminum oxide, magnesium oxide, and titanium oxide are 32 W/m·K, 36 W/m·K, and 22 W/m·K, respectively.

The thermally conductive board 100 could be produced by performing a method described below. First, two metal foils are provided, in which one metal foil is used a metal substrate 11, and the other metal foil is used as a metal layer 14. Using wet etching technique or mechanical processing treatment to rough surfaces of the two metal foils. Subsequently, a ceramic material layer (upper ceramic layer) 13 is formed on the rough surface of the metal layer 14 by thermal spraying, chemical vapor deposition, physical deposition, or sputtering. Because the metal layer 14 has been roughed in advance, the ceramic material layer (upper ceramic layer) 13 is formed on the metal layer 14 in compliance with the rough surface of the metal layer 14. That is, in this step, the ceramic material layer (upper ceramic layer) 13 is conformally formed on the rough surface of the metal layer 14. As such, a microrough surface 16 is generated between the metal layer 14 and the ceramic material layer (upper ceramic layer) 13. Thereafter, the metal substrate 11, a thermal conductive insulating polymer layer 12, the ceramic material layer (upper ceramic layer) 13, and the metal layer 14 are stacked in order from bottom to top, and are hot-pressed to form a laminated plate. Finally, the laminated plate is divided by cutter or using other mechanical technique to produce a quantity of thermally conductive boards 100 with appropriate size.

Figure 2:
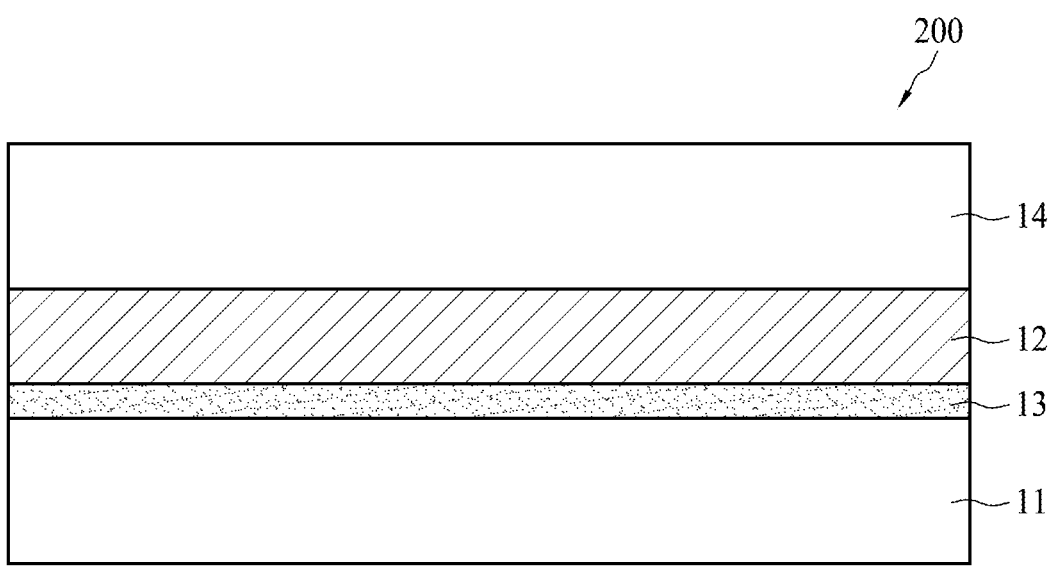
FIG. 2 shows a cross-sectional view of a thermally conductive board in accordance with a second embodiment of the present disclosure.

Referring to FIG. 2, which shows a cross-sectional view of a thermally conductive board 200 in accordance with a second embodiment of the present disclosure. The thermally conductive board 200 differs from the first embodiment in FIG. 1 in that the ceramic material layer 13 is disposed between the thermal conductive insulating polymer layer 12 and the metal substrate 11. In the present embodiment, the ceramic material layer 13 serves as a lower ceramic layer of the thermally conductive board. The ceramic material layer (the lower ceramic layer) 13 forms a physical contact with the metal substrate 11. Because thermal resistance of the ceramic material layer (the lower ceramic layer) 13 does not drop significantly at high temperature, a volume resistivity of the thermally conductive and electrically insulating layer (including the thermal conductive insulating polymer layer 12 and the ceramic material layer 13) of the thermally conductive board 100 is prevented from dropping significantly at high temperature even if the thermal conductive insulating polymer layer 12 has a relatively low thermal resistance at high temperature of 100-250° C. when compared to that at 25° C. Thereby, the problem that volume resistivity of the thermally conductive board drops significantly at high temperature by solely using the thermal conductive insulating polymer layer as the insulating layer in conventional structure is solved. In addition, because the ceramic material layer (the lower ceramic layer) 13 is sandwiched between the thermal conductive insulating polymer layer 12 and the metal substrate 11, the ceramic material layer (the lower ceramic layer) 13 blocks metal ions at lower surface of the metal layer 14 from migrating downwards, solving ionic migration problem. Moreover, as said above, lower surface of the metal layer 14 and upper surface of the metal substrate 11 can be further roughed to facilitate bonding strength between layers, thus making the thermally conductive board have a lower thermal resistance which thereby increases voltage endurance of the thermally conductive board in high-temperature and high-humidity environment.

Figure 3:
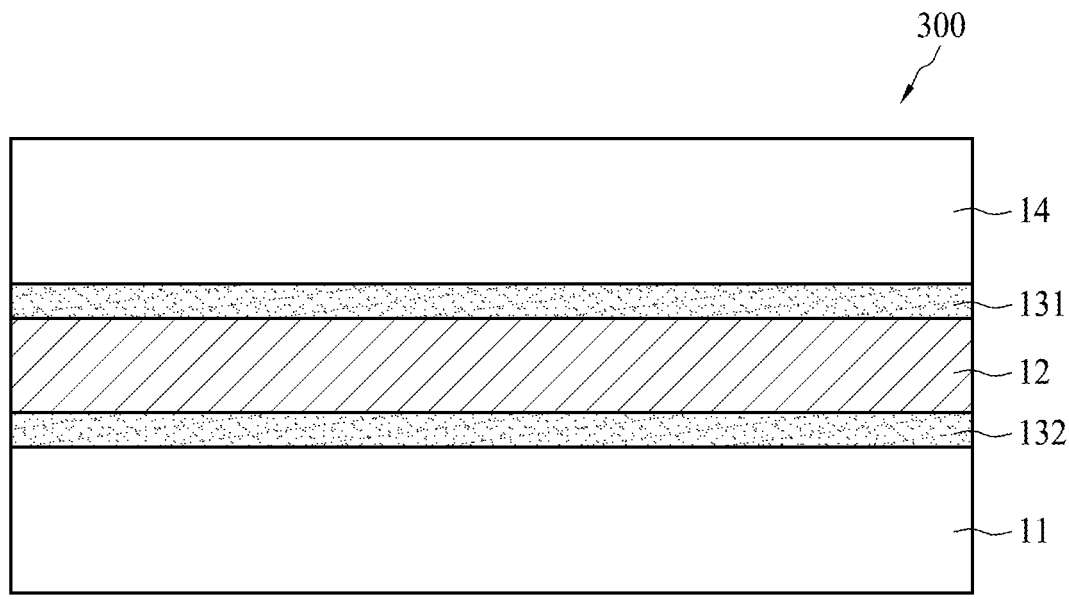
FIG. 3 shows a cross-sectional view of a thermally conductive board in accordance with a third embodiment of the present disclosure.

Referring to FIG. 3, which shows a cross-sectional view of a thermally conductive board 300 in accordance with a third embodiment of the present disclosure. The thermally conductive board 300 differs from that of first embodiment in FIG. 1 or that of second embodiment in FIG. 2 in that the ceramic material layer 13 includes both an upper ceramic layer 131 and a lower ceramic layer 132. The upper ceramic layer 131 forms a physical contact with the metal layer 14. The lower ceramic layer 132 forms a physical contact with the metal substrate 11. Because thermal resistance of the ceramic material layer (including both the upper ceramic layer 131 and the lower ceramic layer 132) does not drop significantly at high temperature, a volume resistivity of the thermally conductive and electrically insulating layer (including the thermal conductive insulating polymer layer 12 and the ceramic material layer 13) of the thermally conductive board 100 is prevented from dropping significantly at high temperature even if the thermal conductive insulating polymer layer 12 has a relatively low thermal resistance at high temperature of 100-250° C. when compared to that at 25° C. Thereby, the problem that volume resistivity of the thermally conductive board drops significantly at high temperature by solely using the thermal conductive insulating polymer layer as the insulating layer in conventional structure is solved. In addition, because the upper ceramic layer 131 and the lower ceramic layer 132 are sandwiched between the metal layer 14 and the thermal conductive insulating polymer layer 12 and between the thermal conductive insulating polymer layer 12 and the metal substrate 11, respectively, the upper ceramic layer 131 and the lower ceramic layer 132 block metal ions at lower surface of the metal layer 14 from migrating downwards, solving ionic migration problem. Moreover, as said above, lower surface of the metal layer 14 and upper surface of the metal substrate 11 can be further roughed to facilitate bonding strength between layers, thus making the thermally conductive board have a lower thermal resistance which thereby increases voltage endurance of the thermally conductive board in high-temperature and high-humidity environment.

Table 1 shows testing conditions and volume resistivity and retention value of embodiments E1-E10 of the present application and comparative examples C1-C3 of a thermally conductive board. The volume resistivities at 25° C. and 175° C. are measured by applying voltage of 500 volts for a duration of 30 seconds. A ratio of a volume resistivity at 175° C. to a volume resistivity at 25° C. for the thermally conductive board is defined as a retention value. The greater the retention value, the more difficultly the volume resistivity of the thermally conductive board declines at high temperature as opposed to room temperature, that is, the volume resistivity of the thermally conductive board does not lower drastically at high temperature when compared to room temperature. All the thermally conductive boards have a size of 10 mm×10 mm, where both the metal layer 14 and the metal substrate 11 are made of copper and have a thickness of 1.0 mm. The thermal conductive insulating polymer layer 12 uses epoxy resin as polymer and uses aluminum oxide as thermal conductive fillers. The thermal conductive fillers have a loading ratio of 50%, 66%, or 72%, such that thermal conductivities of the thermal conductive insulating polymer layer 12 are 2 W/m·K, 6 W/m·K, or 12 W/m·K, respectively. The thickness of the thermal conductive insulating polymer layer 12 is 30 μm, 100 μm, 150 μm, or 200 μm. The ceramic material layer includes an upper ceramic layer 131 and/or a lower ceramic layer 132. Each of the upper ceramic layer 131 and the lower ceramic layer 132 has a thickness of 3 μm, 6 μm, or 100 μm. Each of the upper ceramic layer 131 and the lower ceramic layer 132 is a single material layer made of aluminum oxide ($Al_2O_3$), zirconia ($ZrO_2$), magnesium oxide (MgO), or titanium oxide ($TiO_2$). Alternatively, it could be a multi-layered composite material layer composed of two sublayers of aluminum oxide/titanium oxide ($Al_2O_3/TiO_2$), aluminum oxide/magnesium oxide ($Al_2O_3/MgO$), or aluminum oxide/zirconia ($Al_2O_3/ZrO_2$). If only one ceramic material layer (i.e., the upper ceramic layer or the lower ceramic layer) is included in the thermally conductive board, the upper ceramic layer or the lower ceramic layer has a thickness of 3-100 μm. However, if both the upper ceramic layer and the lower ceramic layer are included in the thermally conductive board, a total thickness of the upper ceramic layer and the lower ceramic layer is 5-200 μm. Each of a lower surface of the metal layer and an upper surface of the metal substrate has a roughness Rz of 2-80 μm, such as 5 μm, 10 μm, 20 μm, 30 μm, 40 μm, 50 μm, 60 μm, or 70 μm. As such, a ratio of the roughness Rz to a thickness of the upper ceramic layer or the lower ceramic layer ranges from 0.5 to 0.8.

TABLE 1

| | Composition of ceramic material layer | Thickness of upper ceramic layer (μm) | Loading ratio of thermal conductive fillers (vol %) | Thermal conductivity of thermal conductive insulating polymer layer (W/m · K) | Thickness of thermal conductive insulating polymer layer (μm) | Thickness of lower ceramic layer (μm) | Volume resistivity at 25° C. (Ω · cm) | Volume resistivity at 175° C. (Ω · cm) | Retention value | Thermal resistance (° C./W) |
|---|---|---|---|---|---|---|---|---|---|---|
| C1 | — | — | 50% | 2 | 200 | — | 8.5E+14 | 4.9E+07 | 5.8E−08 | 0.159 |
| C2 | — | — | 66% | 6 | 100 | — | 7.8E+14 | 2.3E+07 | 2.9E−08 | 0.028 |
| C3 | — | — | 72% | 12 | 200 | — | 2.3E+14 | 3.6E+07 | 1.6E−07 | 0.028 |
| E1 | $Al_2O_3$ | — | 50% | 2 | 150 | 3 | 1.7E+15 | 2.4E+12 | 1.4E−03 | 0.117 |
| E2 | $Al_2O_3$ | — | 66% | 6 | 100 | 100 | 9.3E+14 | 7.5E+13 | 8.1E−02 | 0.034 |
| E3 | $Al_2O_3$ | 3 | 66% | 6 | 200 | 3 | 1.7E+15 | 5.8E+12 | 3.5E−03 | 0.052 |
| E4 | $Al_2O_3$ | 100 | 72% | 12 | 30 | 100 | 2.3E+14 | 1.7E+14 | 7.3E−01 | 0.021 |
| E5 | $ZrO_2$ | — | 50% | 2 | 150 | 3 | 6.1E+14 | 2.8E+12 | 4.6E−03 | 0.118 |
| E6 | MgO | — | 50% | 2 | 150 | 3 | 4.4E+15 | 5.8E+12 | 1.3E−03 | 0.117 |
| E7 | $TiO_2$ | — | 50% | 2 | 150 | 3 | 5.7E+14 | 1.4E+13 | 2.4E−02 | 0.117 |
| E8 | $Al_2O_3/TiO_2$ | — | 66% | 6 | 100 | 6 | 4.2E+15 | 3.2E+13 | 7.5E−03 | 0.029 |
| E9 | $Al_2O_3/MgO$ | — | 66% | 6 | 100 | 6 | 1.1E+15 | 5.3E+12 | 4.8E−03 | 0.029 |
| E10 | $Al_2O_3/ZrO_2$ | — | 66% | 6 | 100 | 6 | 3.1E+15 | 1.2E+13 | 3.9E−03 | 0.029 |

Further seeing Table 1, C1-C3 use a thermal conductive insulating polymer layer 12 having a thermal conductivity of 2-12 W/m·K and a thickness of 100-200 μm. However, there is not any ceramic material layer included in the thermally conductive board. The testing results show a retention value that is quite small, and in other words, the volume resistivity declines drastically at 175° C. as opposed to 25° C.

E1-E4 use a thermal conductive insulating polymer layer 12 having a thermal conductivity of 2-12 W/m·K and a thickness of 30-200 μm, but further use an upper ceramic layer 131 and/or a lower ceramic layer 132 made of aluminum oxide ($Al_2O_3$) and having various thicknesses. The thickness of the thermally conductive and electrically insulating layer of the thermally conductive board could be considered as a total thickness of both the thermal conductive insulating polymer layer 12 and the ceramic material layer 131/132. That is, the thickness of the thermally conductive and electrically insulating layer in E1-E4 is a sum of a thickness of the thermal conductive insulating polymer layer 12 and a thickness of the upper ceramic layer and/or a thickness of the lower ceramic layer, and ranges from 153 μm to 230 μm. Table 1 indicates that E1-E4 have retention values much greater than that of C1-C3, proving that inclusion of a ceramic material layer in the thermally conductive board makes the volume resistivity of the thermally conductive board not to drop drastically at high temperature as opposed to room temperature.

E5-E7 have the same conditions as E1 except that E5-E7 use a lower ceramic layer of a single material layer. The testing results also show that the volume resistivity of the thermally conductive board does not drop drastically at high temperature as opposed to room temperature. E8-E10 use a lower ceramic layer which is a multi-layered composite material layer composed of two sublayers. Taking E8 as an example, the lower ceramic layer is composed of the two sublayers aluminum oxide/titanium oxide ($Al_2O_3/TiO_2$), i.e. one aluminum oxide sublayer and one titanium oxide sublayer. The testing results also show that the volume resistivity of the thermally conductive board does not drop drastically at high temperature as opposed to room temperature.

It is apparent from Table 1 that, with inclusion of a ceramic material layer in the thermally conductive board, the volume resistivity of the thermally conductive board does not drop drastically at high temperature as opposed to room temperature. In an embodiment, a volume resistivity of the thermally conductive board at 175° C. is at least $10^9$ Ω·cm, such as at least $10^{10}$ Ω·cm, at least $10^{11}$ Ω·cm, at least $10^{12}$ Ω·cm, at least $10^{13}$ Ω·cm, at least $10^{14}$ Ω·cm, or at least $10^{15}$ Ω·cm. Moreover, the retention value is at least $10^{-4}$, such as at least $10^{-4}$, at least $10^{-3}$, at least $10^{-2}$, or at least $10^{-1}$. According to the present disclosure, either an upper ceramic layer or a lower ceramic layer can be included in the thermally conductive board, where a thickness of each of the upper ceramic layer and the lower ceramic layer is 3-100 μm. Alternatively, both an upper ceramic layer and a lower ceramic layer can be disposed on upside and downside of the thermal conductive insulating polymer layer 12 of the thermally conductive board, respectively, where a total thickness of the upper ceramic layer and the lower ceramic layer is 5-200 μm.

Table 2 shows testing conditions and thermal cycling test results of embodiments E11-E17 of the present application and comparative examples C4-C6 of a thermally conductive board. The thermal cycling tests is conducted to evaluate whether including a ceramic material layer can increase bonding strength between layers, and thus to obtain optimal roughness. The thermal cycling test is carried out by performing 40° C.-150° C./500 cycles, with each of 40° C. and 150° C. maintaining for 30 minutes and a switch time between 40° C. and 150° C. being less than 5 seconds. All the thermally conductive boards have a size of 10 mm×10 mm, where both the metal layer 14 and the metal substrate 11 are made of copper and have a thickness of 1.0 mm. The thermal conductive insulating polymer layer 12 uses epoxy resin as polymer and uses aluminum oxide as thermal conductive fillers. The thermal conductive fillers have a loading ratio of 50%, 66%, or 72%, such that thermal conductivities of the thermal conductive insulating polymer layer 12 are 2 W/m·K, 6 W/m·K, or 12 W/m·K, respectively. The thickness of the thermal conductive insulating polymer layer 12 is 30 μm, 100 μm, or 200 μm. The ceramic material layer includes an upper ceramic layer 131 and/or a lower ceramic layer 132. Each of the upper ceramic layer 131 and the lower ceramic layer 132 has a thickness of 3 μm, 7 μm, 10 μm, or 100 μm. Each of the upper ceramic layer 131 and the lower ceramic layer 132 is a single material layer made of aluminum oxide ($Al_2O_3$), zirconia ($ZrO_2$), magnesium oxide (MgO), or titanium oxide ($TiO_2$). If only one ceramic material layer (i.e., the upper ceramic layer or the lower ceramic layer) is included in the thermally conductive board, the upper ceramic layer or the lower ceramic layer has a thickness of 3-100 μm. However, if both the upper ceramic layer and the lower ceramic layer are included in the thermally conductive board, a total thickness of the upper ceramic layer and the lower ceramic layer is 5-200 μm.

TABLE 2

|  | Roughness of metal layer (μm) | Composition of ceramic material layer | Thickness of upper ceramic layer (μm) | Thermal conductivity of thermal conductive insulating polymer layer (W/m · K) | Thickness of thermal conductive insulating polymer layer (μm) | Thickness of lower ceramic layer (μm) | Roughness of metal substrate (μm) | Thermal cycling test results |
|---|---|---|---|---|---|---|---|---|
| C4 | 1.3 | $Al_2O_3$ | 7 | 2 | 100 | — | — | Delamination between copper layer and ceramic layer |
| C5 | 1.5 | $Al_2O_3$ | 10 | 6 | 200 | 10 | 1.5 | Delamination between copper layer and ceramic layer |

TABLE 2-continued

| | Roughness of metal layer (μm) | Composition of ceramic material layer | Thickness of upper ceramic layer (μm) | Thermal conductivity of thermal conductive insulating polymer layer (W/m · K) | Thickness of thermal conductive insulating polymer layer (μm) | Thickness of lower ceramic layer (μm) | Roughness of metal substrate (μm) | Thermal cycling test results |
|---|---|---|---|---|---|---|---|---|
| C6 | 1.5 | $Al_2O_3$ | 100 | 12 | 30 | 100 | 1.5 | Delamination between copper layer and ceramic layer |
| E11 | — | $Al_2O_3$ | — | 2 | 200 | 3 | 2.2 | No abnormality |
| E12 | — | $Al_2O_3$ | — | 6 | 100 | 100 | 80 | No abnormality |
| E13 | 2.1 | $Al_2O_3$ | 3 | 6 | 100 | 3 | 2.3 | No abnormality |
| E14 | 80 | $Al_2O_3$ | 100 | 12 | 30 | 100 | 80 | No abnormality |
| E15 | 2.5 | $ZrO_2$ | 3 | 6 | 100 | 3 | 2.3 | No abnormality |
| E16 | 2.4 | MgO | 3 | 6 | 100 | 3 | 2.3 | No abnormality |
| E17 | 2.8 | $TiO_2$ | 3 | 6 | 100 | 3 | 2.3 | No abnormality |

Further seeing Table 2, C4-C6 use a thermal conductive insulating polymer layer 12 having a thermal conductivity of 2-12 W/m·K and a thickness of 30-200 μm. All the ceramic material layers are made of aluminum oxide ($Al_2O_3$). Roughness of the metal layer and the metal substrate is 1.3 μm or 1.5 μm. The thermal cycling test results show that delamination occurs between the metal layer (copper layer) and the upper ceramic layer as well as between the metal substrate (copper layer) and the lower ceramic layer.

E11-E14 use a thermal conductive insulating polymer layer 12 having to a thermal conductivity of 2-12 W/m·K and a thickness of 30-200 μm. All the ceramic material layers are made of aluminum oxide ($Al_2O_3$). Roughness of the metal layer and the metal substrate is 2.1-80 μm. The thermal cycling test results show that there is no delamination phenomenon occurring between the metal layer (copper layer) and the upper ceramic layer or between the metal substrate (copper layer) and the lower ceramic layer.

E15-E17 have the same conditions as E13 except that E15-E17 use a ceramic material layer (an upper ceramic layer or a lower ceramic layer) of a single material layer made of other material different from that of E13. The thermal cycling test results show that there is no delamination phenomenon occurring between the metal layer (copper layer) and the upper ceramic layer or between the metal substrate (copper layer) and the lower ceramic layer.

It is apparent from Table 2 that bonding strength between the metal layer and the upper ceramic layer as well as between the metal substrate and the lower ceramic layer can be increased by controlling roughness of the metal layer and the metal substrate to fall within range of 2-80 μm. In particular, even though the present embodiments of the present application use a metal layer 14 and a metal substrate 11 having a large thickness of 1.0 mm, delamination problem does not occur as long as roughness of the metal layer 14 and the metal substrate 11 are controlled appropriately. This demonstrates that the structural design of the present disclosure is suitable for thick copper applications. Roughness of lower surface of the metal layer and roughness of upper surface of the metal substrate have to fall within an appropriate range, and should not be too high or too low. A too high roughness would result in problem of point discharge at tips of undulating surfaces of the metal layer and the metal substrate, leading to inferior voltage endurance and difficulty in carrying out mechanical processing treatment for realizing roughness. A too low roughness would not be possible for the thermally conductive board to have the above said functional advantages. In an embodiment, each of the lower surface of the metal layer and the upper surface of the metal substrate has a roughness Rz of 2-80 μm, such as 5 μm, 10 μm, 20 μm, 30 μm, 40 μm, 50 μm, 60 μm, or 70 μm. Preferably, a ratio of the roughness Rz to a thickness of the upper ceramic layer or the lower ceramic layer ranges from 0.2 to 0.8, such as 0.3, 0.4, 0.5, 0.6, or 0.7. This numeral range makes the thermally conductive board have strong bonding strength between layers without point discharge problem due to formation of rough surfaces.

Table 3 shows testing conditions and HHBT results of embodiments E18-E27 of the present application and comparative examples C7-C8 of a thermally conductive board. The HHBT results could evaluate voltage endurance of the thermally conductive board in high-temperature and high-humidity environment. The HHBT is conducted by applying DC voltage to the thermally conductive board for a duration of 1000 hours in environment of temperature of 85° C. and relative humidity (R.H.) of 85%. All the thermally conductive boards have a size of 10 mm×10 mm, where both the metal layer 14 and the metal substrate 11 are made of copper and have a thickness of 1.0 mm. The thermal conductive insulating polymer layer 12 uses epoxy resin as polymer and uses aluminum oxide as thermal conductive fillers. The thermal conductive fillers have a loading ratio of 50%, 66%, or 72%, such that thermal conductivities of the thermal conductive insulating polymer layer 12 are 2 W/m·K, 6 W/m·K, or 12 W/m·K, respectively. The thickness of the thermal conductive insulating polymer layer 12 is 30 μm, 100 μm, or 200 μm. The ceramic material layer includes an upper ceramic layer 131 and/or a lower ceramic layer 132. Each of the upper ceramic layer 131 and the lower ceramic layer 132 has a thickness of 3 μm or 100 μm. Each of the upper ceramic layer 131 and the lower ceramic layer 132 is a single material layer made of aluminum oxide ($Al_2O_3$), zirconia ($ZrO_2$), magnesium oxide (MgO), or titanium oxide ($TiO_2$). Alternatively, it could be a multi-layered composite material layer composed of two sublayers of zirconia/titanium oxide ($ZrO_2/TiO_2$), zirconia/magnesium oxide ($ZrO_2$/MgO), aluminum oxide/zirconia ($Al_2O_3/ZrO_2$). If only one ceramic material layer (i.e., the upper ceramic layer or the lower ceramic layer) is included in the thermally conductive board, the upper ceramic layer or the lower ceramic layer has a thickness of 3-100 μm. However, if both the upper ceramic layer and the lower ceramic layer are included in the thermally conductive board, a total thickness of the upper ceramic layer and the lower ceramic layer is 5-200 μm.

TABLE 3

| Composition of ceramic material layer | Thickness of upper ceramic layer (μm) | Thermal conductivity of thermal conductive insulating polymer layer (W/m · K) | Thickness of thermal conductive insulating polymer layer (μm) | Thickness of lower ceramic layer (μm) | HHBT results | | | |
|---|---|---|---|---|---|---|---|---|
| | | | | | DC300 V | DC500 V | DC1000 V | DC2000 V |
| C7 | — | — | 2 | 100 | — | Pass | Fail | Fail | — |
| C7 | — | — | 2 | 100 | — | Pass | Fail | Fail | — |
| C8 | — | — | 12 | 200 | — | Pass | Pass | Fail | — |
| E18 | $Al_2O_3$ | — | 2 | 200 | 3 | Pass | Pass | Pass | Fail |
| E19 | $Al_2O_3$ | — | 2 | 100 | 100 | Pass | Pass | Pass | Pass |
| E20 | $Al_2O_3$ | 3 | 6 | 100 | 3 | Pass | Pass | Pass | Pass |
| E21 | $Al_2O_3$ | 100 | 12 | 30 | 100 | Pass | Pass | Pass | Pass |
| E22 | $ZrO_2$ | 3 | 6 | 100 | 3 | Pass | Pass | Pass | Pass |
| E23 | MgO | 3 | 6 | 100 | 3 | Pass | Pass | Pass | Pass |
| E24 | $TiO_2$ | 3 | 6 | 100 | 3 | Pass | Pass | Pass | Pass |
| E25 | $ZrO_2/TiO_2$ | 3 | 6 | 100 | 3 | Pass | Pass | Pass | Pass |
| E26 | $ZrO_2/MgO$ | 3 | 6 | 100 | 3 | Pass | Pass | Pass | Pass |
| E27 | $Al_2O_3/ZrO_2$ | 3 | 6 | 100 | 3 | Pass | Pass | Pass | Pass |

Further seeing Table 3, C7-C8 use a thermal conductive insulating polymer layer 12 having a thermal conductivity of 2-12 W/m·K and a thickness of 100-200 μm. However, there is not any ceramic material layer included in the thermally conductive board. The HHBT results show that C7-C8 can pass DC voltage of 300-500 volts (i.e., DC300V-DC500V) only.

E18-E21 use a thermal conductive insulating polymer layer 12 having a thermal conductivity of 2-12 W/m·K and a thickness of 30-200 μm. All the ceramic material layers are made of aluminum oxide ($Al_2O_3$). If only one ceramic material layer (i.e., the upper ceramic layer or the lower ceramic layer) is included in the thermally conductive board, the upper ceramic layer or the lower ceramic layer has a thickness of 3-100 μm. However, if both the upper ceramic layer and the lower ceramic layer are included in the thermally conductive board, a total thickness of the upper ceramic layer and the lower ceramic layer is 5-200 μm. The HHBT results show that E18 can pass DC1000V, while E19-E21 can pass DC2000V. E19-E21 have higher voltage endurance than that of E18 because a total thickness of the ceramic material layer in E19-E21 is thicker and thus the thermally conductive board can endure higher DC voltage.

E22-E27 have the same conditions as E20 except that E22-E27 use a ceramic material layer (including an upper ceramic layer and/or a lower ceramic layer) of a single material layer made of other material different from that of E20, or use a ceramic material layer of a multi-layered composite material layer composed of two sublayers. The HHBT results show that all E22-E27 can pass DC2000V.

It is apparent from Table 3 that, with inclusion of a ceramic material layer in the thermally conductive board, voltage endurance of the thermally conductive board is increased. In particular, if only one ceramic material layer (i.e., the upper ceramic layer or the lower ceramic layer) is included in the thermally conductive board, the upper ceramic layer or the lower ceramic layer has a thickness of 3-100 μm. However, if both the upper ceramic layer and the lower ceramic layer are included in the thermally conductive board, a total thickness of the upper ceramic layer and the lower ceramic layer is 5-200 μm. Such range of thickness could increase voltage endurance of the thermally conductive board to an extent of at least DC1000V, or even at least DC2000V.

Table 4 shows testing conditions and thermal resistance test results of embodiments E28-E33 of the present application and comparative examples C9-C10 of a thermally conductive board. To execute the thermal resistance test, a TO-220 power transistor is used as a heat source, where the TO-220 power transistor has an output power W of about 60 watts. A pattern of the metal layer to which the TO-220 power transistor is connectively welded has a top area of 10 mm×10 mm=100 mm². After measuring a temperature T1 at top of the thermally conductive board (i.e., a position between the TO-220 power transistor and the thermally conductive board) and a temperature T2 at bottom of the thermally conductive board (i.e. a position between the thermally conductive board and a heat sink coupled thereto), a thermal resistance of the thermally conductive board is calculated by the following equation: Thermal Resistance= $(T1-T2)/W=\Delta T/W$. The standard thermal resistance test method of ASTM D5470 is not used because ASTM D5470 test results can be used to evaluate heat dissipation characteristics of a board along the longitudinal direction (z-axis) only. In contrast, TO-220 test results can evaluate heat dissipation characteristics of a board along various directions (including z-axis as well as x-axis and y-axis). The TO-220 test results can show more precisely how much influence caused by using thick copper layer on the thermally conductive board. All the thermally conductive boards have a size of 40 mm×40 mm, where the metal layer 14 is made of copper (Cu) and the metal substrate 11 is made of copper (Cu) or aluminum (Al). The thermal conductive insulating polymer layer 12 uses epoxy resin as polymer and uses aluminum oxide as thermal conductive fillers. The thermal conductive fillers have a loading ratio of 50%, 66%, or 72%, such that thermal conductivities of the thermal conductive insulating polymer layer 12 are 2 W/m·K, 6 W/m·K, or 12 W/m·K, respectively. The thickness of the thermal conductive insulating polymer layer 12 is 100 μm. The ceramic material layer includes an upper ceramic layer 131 and/or a lower ceramic layer 132. The upper ceramic layer 131 has a thickness of 6 μm, and the lower ceramic layer 132 has a thickness of 3 μm. Each of the upper ceramic layer 131 and the lower ceramic layer 132 is a single material layer made of aluminum oxide ($Al_2O_3$) or magnesium oxide (MgO). Alternatively, it is a multi-layered composite material layer composed of two sublayers of aluminum oxide/magnesium oxide ($Al_2O_3$/MgO), i.e., one aluminum oxide sublayer and one magnesium sublayer.

TABLE 4

| | Composition of ceramic material layer | Thickness of upper ceramic layer (μm) | Thickness of upper ceramic layer (μm) | Thermal conductivity of thermal conductive insulating polymer layer (W/m·K) | Thickness of thermal conductive insulating polymer layer (μm) | Thickness of lower ceramic layer (μm) | Material and thickness of metal substrate (mm) | Output power (W) | Temperature of transistor T1 (°C.) | Temperature at bottom of thermal conductive insulating polymer layer T2 (°C.) | Temperature difference ΔT (°C.) | Thermal resistance (°C./W) |
|---|---|---|---|---|---|---|---|---|---|---|---|---|
| C9  | —         | —   | 0.1 | 12 | 100 | —  | Cu: 0.3 | 60.2 | 54.3 | 29.1 | 25.2 | 0.419 |
| C10 | —         | —   | 0.1 | 12 | 100 | —  | Al: 0.3 | 60.1 | 56.6 | 28.3 | 28.3 | 0.471 |
| E28 | Al₂O₃     | 0.3 | 6   | 2  | 100 | 3  | Cu: 0.3 | 60.2 | 46.7 | 30.5 | 16.2 | 0.269 |
| E29 | Al₂O₃     | 10  | 6   | 2  | 100 | 3  | Al: 0.3 | 60.2 | 38.5 | 32.5 | 6.0  | 0.100 |
| E30 | MgO       | 0.3 | 6   | 6  | 100 | 3  | Al: 0.3 | 60.2 | 43.8 | 30.7 | 13.1 | 0.218 |
| E31 | MgO       | 10  | 6   | 12 | 100 | 3  | Al: 0.3 | 60.2 | 38.2 | 32.6 | 5.6  | 0.093 |
| E32 | Al₂O₃/MgO | 0.3 | 6   | 2  | 100 | 3  | Al: 0.3 | 60.1 | 45.3 | 30.7 | 14.6 | 0.243 |
| E33 | Al₂O₃/MgO | 10  | 6   | 2  | 100 | 3  | Al: 0.3 | 60.0 | 38.4 | 32.6 | 5.8  | 0.097 |

Further seeing Table 4, C9-C10 use a thermal conductive insulating polymer layer 12 having a thermal conductivity of 12 W/m·K and a thickness of 100 μm. The thickness of the metal layer is 0.1 mm, which is not thick. The thickness of the metal substrate is 0.3 mm, which is thicker. However, there is not any ceramic material layer included in the thermally conductive board. The thermal resistance test results show that thermal resistances of C9 and C10 are 0.419° C./W and 0.471° C./W, respectively.

E28-E33 use a ceramic material layer (including an upper ceramic layer and a lower ceramic layer) of a single material layer, or use a ceramic material layer of a multi-layered composite material layer composed of two sublayers. The thermal conductivities of the thermal conductive insulating polymer layer 12 are 2 W/m·K, 6 W/m·K, or 12 W/m·K, respectively. The thickness of the thermal conductive insulating polymer layer 12 is 100 μm. The thickness of the metal layer is 0.3 mm or 10 mm, which is thicker. The thickness of the metal substrate is 0.3 mm, which is thicker. The thermal resistance test results show that thermal resistances of E28-E33 ranges from 0.09° C./W to 0.27° C./W.

It is apparent from Table 4 that, although E28-E33 uses a thicker metal layer than that of C9-C10, E28-E33 have a lower thermal resistance than that of C9-C10. Clearly, E28-E33 could be used in thick copper applications and have superior heat dissipation characteristics, and as shown in Table 2, do not have delamination problem. In practice, the metal layer could be made of copper, and the metal substrate could be made of copper, aluminum, or alloy of copper/aluminum. According to the present disclosure, the so-called thick copper application refers to a thermally conductive board having a metal layer and a metal substrate with each having a thickness of 0.3-10 mm, such as 1 mm, 2 mm, 3 mm, 4 mm, 5 mm, 6 mm, 7 mm, 8 mm, or 9 mm.

In the thermally conductive board of the present application, a ceramic material layer is included therein so that volume resistivity of the thermally conductive board does not drop drastically at high temperature. In addition, a surface of the metal substrate and/or the metal substrate is roughed to increase bonding strength between layers without delamination problem. The thermally conductive board of the present application also exhibits superior heat dissipation characteristics.

The above-described embodiments of the present invention are intended to be illustrative only. Numerous alternative embodiments may be devised by persons skilled in the art without departing from the scope of the following claims.

What is claimed is:

1. A thermally conductive board, comprising:
   a metal substrate;
   a metal layer;
   a thermal conductive insulating polymer layer located between the metal layer and the metal substrate; and
   a ceramic material layer, wherein the ceramic material layer comprises an upper ceramic layer or a lower ceramic layer, or comprises both the upper ceramic layer and the lower ceramic layer, wherein the upper ceramic layer is disposed between the metal layer and the thermal conductive insulating polymer layer, and the lower ceramic layer is disposed between the thermal conductive insulating polymer layer and the metal substrate;
   wherein the metal layer has a thickness of 0.3-10 mm;
   wherein when only one of the upper ceramic layer and the lower ceramic layer is included in the thermally conductive board, each of the upper ceramic layer and the lower ceramic layer has a thickness of 3-100 μm; when both the upper ceramic layer and the lower ceramic layer are included in the thermally conductive board, a total thickness of the upper ceramic layer and the lower ceramic layer is 5-200 μm;
   wherein a ratio of a volume resistivity at 175° C. to a volume resistivity at 25° C. for the thermally conductive board is defined as a retention value, and the retention value is at least $10^{-4}$; and
   wherein a voltage endurance of the thermally conductive board under HHBT at a temperature of 85° C. and a relative humidity of 85% for a duration of 1000 hours is at least DC1000V.

2. The thermally conductive board of claim 1, wherein the volume resistivity of the thermally conductive board at 175° C. is at least $10^9 \Omega \cdot cm$.

3. The thermally conductive board of claim 1, wherein the upper ceramic layer forms a physical contact with the metal layer, and the lower ceramic layer forms a physical contact with the metal substrate.

4. The thermally conductive board of claim 1, wherein each of the upper ceramic layer and the lower ceramic layer is a single material layer or a multi-layered composite material layer composed of a plurality of sublayers, and wherein each of the single material layer and the sublayers comprises aluminum oxide, zirconia, magnesium oxide, or titanium oxide.

5. The thermally conductive board of claim 1, wherein the metal substrate has a thickness of 0.3-10 mm.

6. The thermally conductive board of claim 1, wherein each of a lower surface of the metal layer and an upper surface of the metal substrate has a roughness Rz of 2-80 μm.

7. The thermally conductive board of claim 6, wherein a ratio of the roughness Rz to the thickness of the upper ceramic layer or the lower ceramic layer ranges from 0.2 to 0.8.

8. The thermally conductive board of claim 1, wherein a thermal resistance of the thermally conductive board is less than 0.16° C./W.

* * * * *